(12) United States Patent  
Geiser et al.

(10) Patent No.: US 8,097,084 B2  
(45) Date of Patent: Jan. 17, 2012

(54) VACUUM CHAMBER SYSTEM FOR SEMICONDUCTOR PROCESSING

(75) Inventors: Friedrich Geiser, Nueziders (AT); Rene Brulc, Hoechst (AT)

(73) Assignee: Vat Holding AG, Haag (CH)

( * ) Notice: Subject to any disclaimer, the term of this patent is extended or adjusted under 35 U.S.C. 154(b) by 1370 days.

(21) Appl. No.: 11/655,111

(22) Filed: Jan. 19, 2007

(65) Prior Publication Data

US 2007/0186851 A1    Aug. 16, 2007

(30) Foreign Application Priority Data

Jan. 24, 2006  (CH) ......................................... 111/06

(51) Int. Cl.
  *C23C 16/54*   (2006.01)
  *C23C 14/56*   (2006.01)
  *H01L 21/67*   (2006.01)
  *C23F 1/00*    (2006.01)

(52) U.S. Cl. .................. 118/719; 118/733; 156/345.31; 156/345.32; 414/939; 204/298.23; 204/298.25; 204/298.35

(58) Field of Classification Search .................. 118/719, 118/733; 156/345.32, 345.31; 414/939; 204/298.23, 298.25, 298.35
See application file for complete search history.

(56) References Cited

U.S. PATENT DOCUMENTS

| 5,076,205 | A  |   | 12/1991 | Vowles et al. |
| 5,292,393 | A  |   | 3/1994  | Maydan et al. |
| 5,364,219 | A  | * | 11/1994 | Takahashi et al. ............ 414/217 |
| 6,235,171 | B1 | * | 5/2001  | Yamamoto ............... 204/298.25 |
| 6,273,664 | B1 | * | 8/2001  | Doche ........................... 414/217 |
| 6,393,716 | B1 | * | 5/2002  | Chang et al. ...................... 34/61 |
| 6,793,766 | B2 | * | 9/2004  | Schieve et al. ........... 156/345.32 |

* cited by examiner

*Primary Examiner* — Karla Moore
(74) *Attorney, Agent, or Firm* — Rothwell, Figg, Ernst & Manbeck, P.C.

(57) ABSTRACT

A vacuum chamber system for semiconductor processing includes at least two evacuable vacuum chambers for receiving semiconductor elements to be processed, each including a vacuum chamber opening and a vacuum chamber sealing surface, and transfer aspects by which one of the vacuum chambers can be moved relative to another of the vacuum chambers and can be docked with it in a vacuum-tight manner by producing substantially parallel opposite positions of the vacuum chamber sealing surfaces which are subject to possible misalignments. At least one of the vacuum chambers has support aspects which support one vacuum chamber on the other vacuum chamber in the evacuated, docked state. The support aspects are in the form of two support elements which are arranged on opposite sides of the vacuum chamber opening, are substantially parallel to the opening central axis and have an operative connection to one another and have a force and displacement balance relative to one another with a balance center located substantially on the opening central axis, so that, in the docked state non-parallel positioning of the vacuum chamber sealing surfaces opposite one another, caused by possible misalignments, is compensated on support.

15 Claims, 5 Drawing Sheets

VACUUM CHAMBER SYSTEM FOR SEMICONDUCTOR PROCESSING

BACKGROUND OF THE INVENTION

1. Field of the Invention

The invention relates to a vacuum chamber system for semiconductor processing.

2. Description of the Background Art

Vacuum chamber systems of the type mentioned at the outset are known in different embodiments from the prior art and are used in particular in the area of IC and semiconductor production, which has to take place in a protected atmosphere as far as possible without the presence of contaminating particles. For example, in a production plant for semiconductor wafers or liquid crystal substrates, the highly sensitive semiconductor or liquid crystal elements pass sequentially through a plurality of process chambers in which the semiconductor elements present inside the process chamber are processed by means of one processing apparatus in each case. Both during the processing inside the process chamber and during the transport from process chamber to process chamber, the highly sensitive semiconductor elements must always be present in a protected atmosphere—in particular in an air-free environment.

The prior art, for example, U.S. Pat. No. 5,076,205 or U.S. Pat. No. 5,292,393, discloses multichamber systems for the production of semiconductor elements—in particular semiconductor wafers—in which a plurality of process chambers are arranged in a star-shaped manner around a central transfer chamber. The central transfer chamber is connected via a tunnel to a second transfer chamber, around which further process chambers are arranged in a star-shaped manner, so that a large cohesive semiconductor production system can be produced by means of a multiplicity of such processing islands.

The semiconductor elements are transported from one process chamber via the transfer chamber into the next process chamber by means of a handling system arranged in the transfer chamber. The very short transport distances within a processing island constitute an advantage of this proven technology. Since the central transfer chamber as well as the process chambers can be in the evacuated state during the entire process, no complicated introduction and removal of components are required for transport.

The star-shaped vacuum chamber systems described are used for different areas of semiconductor production and have proven useful for the production and processing of small to medium-sized semiconductor components. However, new technical areas require increasingly large integral semiconductor components which require the provision of novel semiconductor production systems. Examples of this are flat screens or solar panels having a width of more than two meters. For processing such large semiconductor components, process chambers having correspondingly large dimensions are required. For a star-shaped arrangement of these process chambers in the form of a plurality of processing islands, including the respective infrastructure, an area for erection of the entire semiconductor production system is required which usually exceeds the dimensions of customary production halls, which generally have an elongated floor area too narrow for such arrangements.

The prior art also discloses vacuum chamber systems whose process chambers are arranged along a line and have openings which can be sealed vacuum-tight and point in a common direction. The known system is described below. A transfer chamber which can be moved linearly parallel to the process chamber line can be docked with the individual process chambers and serves for transporting the components from one process chamber to the next process chamber. For this purpose, the transfer chamber opening of the evacuated transfer chamber is docked vacuum-tight with a process chamber opening. The closures of the process chamber and of the transfer chamber, which in particular are in the form of slide valves, are then opened. Owing to the connection between the two evacuated spaces, the two chambers exert a considerable force relative to one another. The semiconductor components are transported by means of a conveyer apparatus, for example a handling robot, from the process chamber into the transfer chamber for transport to the next transfer chamber. After the openings have been closed and the pressure in the intermediate space increased, the semiconductor components protected in the evacuated atmosphere are brought via transfer means, which are formed, for example, by a high-precision rail system, to the next process chamber by linear displacement of the transfer chamber.

A disadvantage of this known system is that docking of the transfer chamber with the process chamber has to take place in a highly accurate manner. After docking and before opening, it must be ensured that the sealing surfaces of the process chamber and of the transfer chamber lie tightly next to one another or one on top of the other in such a way that vacuum-tight contact results after opening of the closures. Since the sealing surface between the transfer chamber and the process chamber can withstand only a certain maximum contact pressure which is well below the force caused by the mutual compression, supports which act between the chambers and appropriately limit the distance between the sealing surfaces and absorb the force are provided on the transfer chamber and/or the process chamber. When the sealing surfaces or the supports are not sufficiently precisely aligned with one another, in particular due to insufficiently precise docking, vacuum-related pressing together of the two chambers results in a relative movement until the transfer chamber is supported on the process chamber and the sealing surfaces come to rest properly one on top of the other. Either the transport chamber or the process chamber yields to this relative movement to a limited extent, for example by means of appropriately formed bearings.

Such vacuum chamber systems have been used to date especially in an experimental manner for vacuum chambers having small dimensions. Although precise alignment of the transfer chamber with the process chamber presents no problems in the case of small opening sizes and relatively low chamber weights, it was not possible to date satisfactorily to solve the problem of docking since firstly high-precision guides are required for correct alignment and secondly the use of complicated bearings is necessary for permitting the relative movement due to the vacuum-related pressing together of the chambers.

Since this problem could not be adequately solved even in the case of small to medium vacuum chamber sizes, the use of such a system appears to be ruled out in principle in spite of the potential of a more compact arrangement for large chamber systems, in particular having an opening width of more than two meters, in the case of which, owing to even greater chamber dimensions, opening sizes and chamber weights, misalignment can be ruled out even to a lesser extent than in the case of systems having smaller dimensions.

SUMMARY OF THE INVENTION

It is therefore an object of the invention to provide a vacuum chamber system of the generic type which has a plurality of process chambers for semiconductor processing, is suitable for the processing of semiconductor elements having large dimensions in a protected atmosphere and is distinguished by a flexible, in particular modular basic structure.

This object is achieved by the realization of the features disclosed herein. Features which develop the invention in an alternative or advantageous manner are disclosed herein.

The vacuum chamber system according to the invention for semiconductor processing has at least two evacuable vacuum chambers provided for receiving semiconductor elements to be processed, for example wafers or liquid crystal substrates. The vacuum is generated, for example, by means of a vacuum pump which is connected to the vacuum chambers. One vacuum chamber is, for example, in the form of a process chamber comprising at least one processing apparatus for processing semiconductor elements present inside the process chamber, while the other vacuum chamber is in particular a transfer chamber for transporting the semiconductor elements to another chamber. The vacuum chambers each have a vacuum chamber opening through which the semiconductor elements can be transported into and out of the vacuum chamber and a vacuum chamber sealing surface which surrounds the vacuum chamber opening. The vacuum chamber opening has, for example, a rectangular or round cross-section and defines an opening central axis which passes through the midpoint of the opening, extends along the course of the opening and in particular runs substantially normal to the plane of the vacuum chamber sealing surface. Moreover, the vacuum chamber system comprises transfer means, by which a vacuum chamber, for example the transfer chamber, can be moved relative to another vacuum chamber, for example the process chamber, and can be docked vacuum-tight with the latter. The docking is effected, for example, by parallel displacement of one chamber with its vacuum chamber opening over the vacuum chamber opening of the other vacuum chamber and by reduction of the perpendicular distance between the vacuum chambers, so that the vacuum chamber sealing surfaces are brought into positions opposite one another which are substantially parallel although subject to possible misalignments. Thus, after opening of the closures of the vacuum chamber openings, in particular by means of slide valves, semiconductor elements can be transported from one vacuum chamber into the other vacuum chamber and vice versa by means of a transport apparatus, for example a handling robot, in a protected atmosphere. At least one of the vacuum chambers has support means which ensure support of one vacuum chamber on the other vacuum chamber in the evacuated, docked state in a direction substantially parallel to the opening central axes, in order to permit a defined position of the vacuum chamber sealing surfaces relative to one another at least within a region when the two vacuum chambers are pressed together under a vacuum. According to the invention, the support means are in the form of at least two support elements arranged on opposite sides of the vacuum chamber opening, adjustable substantially parallel to the opening axis and having an operative connection to one another. The at least two support elements are balanced with respect to force and displacement relative to one another with a balance center located substantially on the opening central axis, so that, in the docked state, the support means result in two rotational degrees of freedom of the two vacuum chambers relative to one another substantially perpendicular to the opening central axis, and non-parallel positioning of the vacuum chamber sealing surfaces opposite one another as a result of possible misalignments is compensated on support. Thus, the support means enable one vacuum chamber to be movable relative to the other vacuum chamber in the supported state about a center of rotation, namely the balance center, which lies substantially on the opening central axis of the vacuum chamber having the support elements, about two axes of rotation which are perpendicular to one another and both of which are perpendicular to the opening central axis and pass through the center of rotation, within a limited range in two rotational degrees of freedom. In the case of a skew docking, where the two opening axes are not parallel to one another and hence the vacuum chamber sealing surfaces too are not exactly parallel, support of one vacuum chamber on the other is nevertheless possible without there being a relative rotational movement between the chambers about an axis which is perpendicular to the opening central axis when the vacuum chambers are pressed together. While an offset of the two vacuum chamber surfaces relative to one another in the form of a parallel offset of the opening central axes within certain limits scarcely affects the support behavior since the distance between the vacuum chamber sealing surfaces present in opposite positions remains constant, an unintentional skew position may have dramatic consequences. For example, in the case of an elongated valve chamber opening having a width of 2 meters, a misalignment of one vacuum chamber relative to the other by only 0.15° results in a distance difference of about 5 millimeters along the vacuum chamber sealing surfaces. Such a difference can be taken up by the support means according to the invention without inevitable yielding of the vacuum chamber or of the vacuum chamber sealing surface, so that destruction of the apparatus is avoided.

In order to ensure vacuum-tight sealing within this distance difference between the two vacuum chamber sealing surfaces, the invention provides sealing means which are in the form of at least one seal carrier ring. The seal carrier ring is mounted on one vacuum chamber sealing surface so as to be displaceable substantially in a direction parallel to the opening central axis thereof and tiltable relative to this vacuum chamber sealing surface, by means of bearing elements in such a way that the seal carrier ring in the docked state is present at least partly between the vacuum chamber sealing surface and the other vacuum chamber sealing surface. The seal carrier ring comprises at least one compensating sealing element which is arranged between one vacuum chamber, in particular one vacuum chamber sealing surface, and the seal carrier ring in such a way that, on displacement and tilting of the seal carrier ring, a vacuum-tight contact is maintained between the seal carrier ring and one vacuum chamber sealing surface. Furthermore, the seal carrier ring comprises at least one front sealing element which seals an end face and points toward the other vacuum chamber sealing surface and is intended for producing a vacuum-tight contact between the seal carrier ring and the other vacuum chamber sealing surface in the docked state. This ensures that positioning of the vacuum chamber sealing surfaces in positions not parallel to one another during sealing, which is caused by possible misalignments, is compensated and the vacuum-tight seal between the two vacuum chambers is ensured.

It is of course possible to arrange the support means according to the invention and the sealing means according to the invention either on a common vacuum chamber or on different vacuum chambers. An arrangement of both the support means and the sealing means on the transfer chamber is advantageous since in this case only one chamber of the vacuum chamber system need be appropriately equipped. An arrangement on the process chambers, a mixed arrangement or a double arrangement both on the process chambers and on the transfer chamber can likewise be realized.

BRIEF DESCRIPTION OF THE DRAWINGS

The vacuum chamber system according to the invention is described in more detail below, purely by way of example, with reference to specific working examples shown schematically in the drawings, further advantages of the invention also being discussed. Specifically.

DETAILED DESCRIPTION OF THE INVENTION

Figure 1:
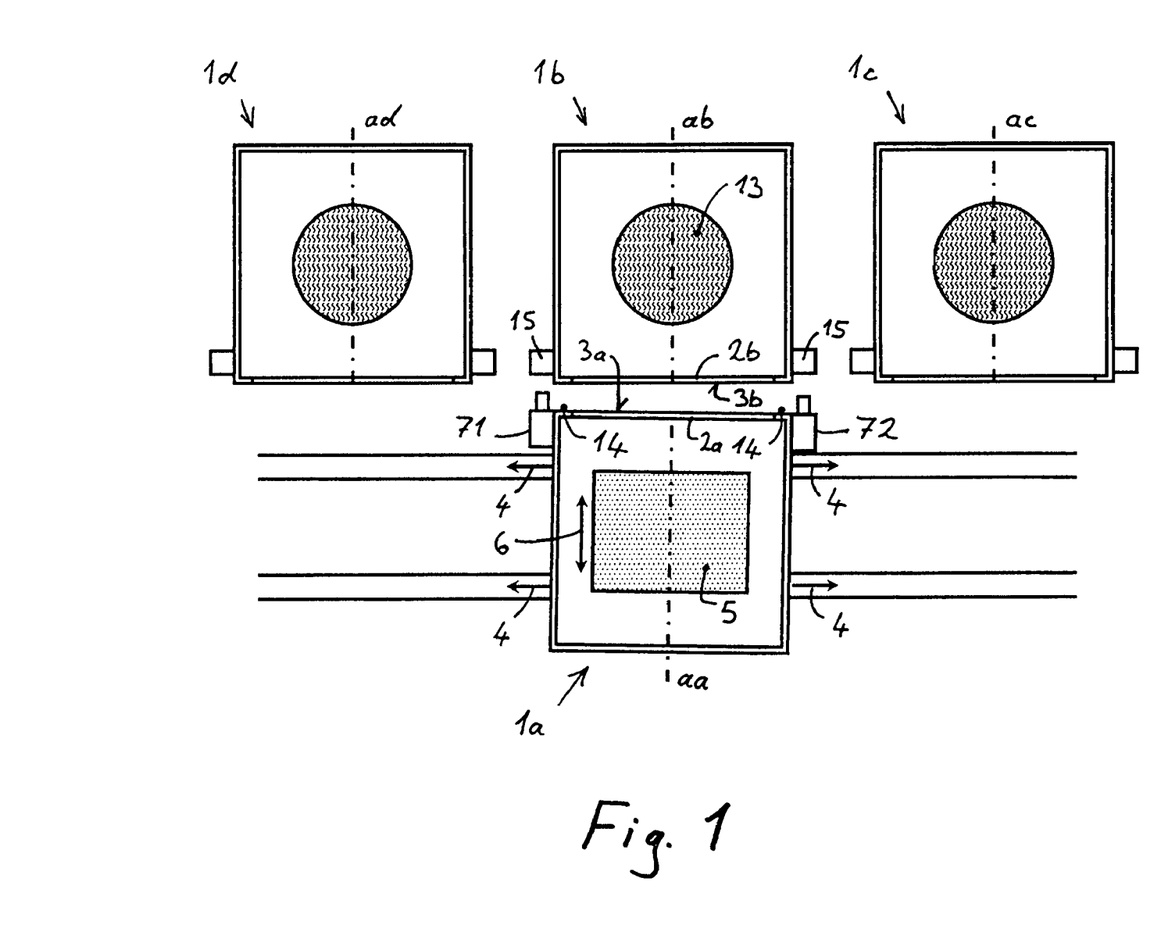
FIG. 1 shows a plan view of a vacuum chamber system before docking of a transfer chamber.
Figure 2:
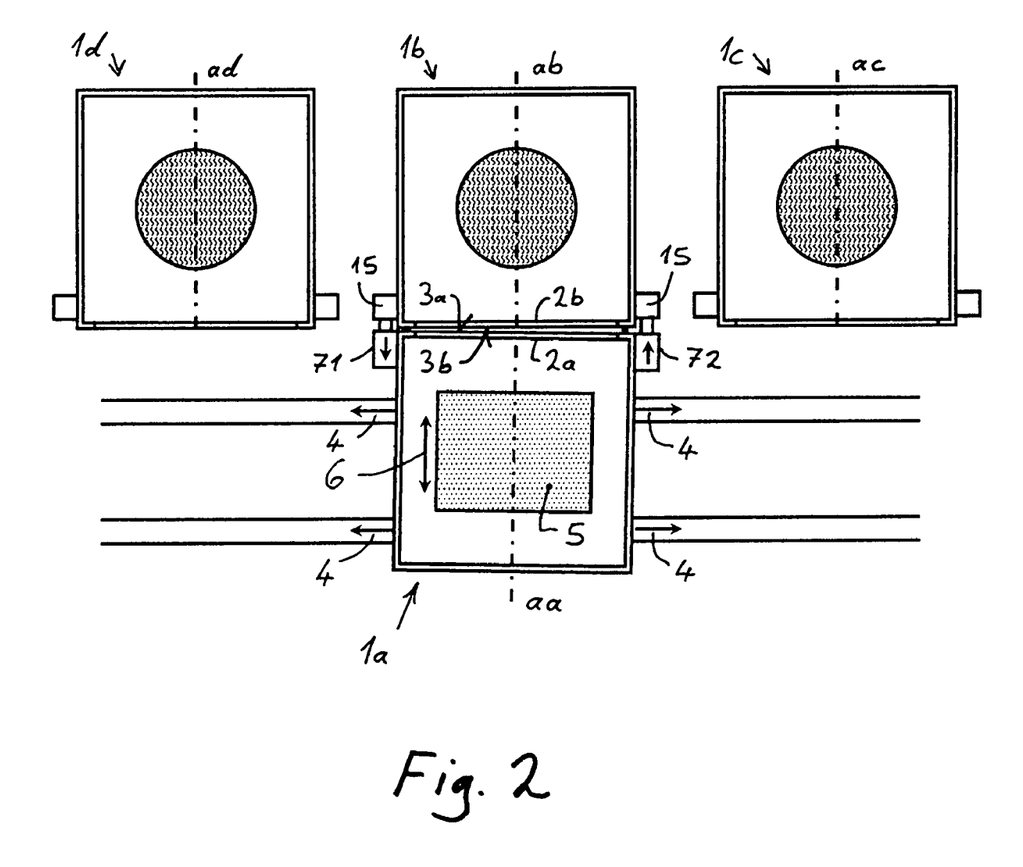
FIG. 2 shows a plan view of the vacuum chamber system after docking of the transfer chamber.

FIG. 1 and FIG. 2 each show a plan view of a vacuum chamber system for semiconductor processing, comprising a first process chamber 1b, second process chamber 1c and a third process chamber 1d. Since the process chambers 1b, 1c and 1d in the working example are substantially identical, only the first process chamber 1b will be described in detail below. The process chambers 1b, 1c and 1d can be sealed vacuum-tight and can be evacuated and have in each case at least one processing apparatus 13 for processing semiconductor elements 5 which can be arranged inside the respective process chamber 1b. The semiconductor elements 5 can be transported via a process chamber opening 2b into and out of the respective process chamber 2b. Closing the process chamber openings 2b is effected, for example, by means of a slide valve which is not shown. A process chamber sealing surface 3b surrounds the respective process chamber opening 2b. In order to be able to transport the semiconductor elements 5 from and to the individual process chambers 1b, 1c and 1d, an evacuable transfer chamber 1a is also provided which can be moved by transfer means 4 relative to the process chambers 1b, 1c and 1d and can be docked vacuum-tight with in each case a process chamber 1b, 1c or 1d. In this example, the transfer means 4 are in the form of linear travel means. The transfer chamber 1a has an appropriately dimensioned transfer chamber opening 2a which can be docked with the process chamber openings 2b of the process chambers 1b, 1c and 1d and through which the semiconductor elements 5 can be transported from the transfer chamber 1a into the docked process chamber 1b—and vice versa—by means of a conveyer apparatus 6, for example a small handling robot. The transfer chamber 1a is, for example, also sealable vacuum-tight by means of a slide valve which is not shown.

The process chambers 1b, 1c and 1d are arranged parallel side by side with parallel opening central axes ab, ac and ad. The transfer means 4 are formed for linear movement of the transfer chamber 1a relative to the process chambers 1b, 1c and 1d in a substantially perpendicular direction to the opening central axis aa, ab, ac and ad.

A transfer chamber sealing surface 3a surrounds the transfer chamber opening 2a. The process chamber sealing surface 3b and the transfer chamber sealing surface 3a are formed so that, by docking the transfer chamber 1a with the process chamber 1b, said transfer chamber sealing surface can be brought into a position opposite the process chamber sealing surface 3b which is substantially parallel but subject to possible misalignment, vacuum-tight contact between the transfer chamber sealing surface 3a and the process chamber sealing surface 3b being produced. FIG. 1 and FIG. 2 illustrate the misalignment in the form of a rotation about the vertical axis. For vacuum-tight sealing, sealing means 14 shown in simplified form are provided, which sealing means are mounted on the transfer chamber sealing surface 3a and are flexible in a direction perpendicular to the transfer chamber sealing surface 3a so that, in substantially parallel opposite positions, they compensate the distance to the process chamber sealing surface 3b, which is not inevitably constant along the transfer chamber sealing surface 3a owing to the possible misalignment, in such a way that vacuum-tight contact is produced. FIG. 1 shows a still undocked state in which the transfer chamber 1a is present with its transfer chamber sealing surface 3a in a position opposite the process chamber sealing surface 3b which is substantially but not quite parallel, sealing contact not yet having been produced. By horizontal movement of the transfer chamber perpendicularly toward the process chamber 1b and hence reduction of the horizontal distance, the transfer chamber sealing surface 3a and the process chamber sealing surface 3b arrive at opposite positions which are such a small distance apart that vacuum-tight contact is produced by the sealing means 14, cf. FIG. 2. Since the surfaces 3a and 3b are not quite parallel to one another, for example with an error of 0.15°, the sealing means 14 must compensate this distance difference appropriately. The working example shown relates to a large vacuum chamber system having transfer and process chamber openings 2a and 2b with a rectangular cross-section having unequal sides, a width of more than 2 meters and a height of about 0.5 meter. In the case of an alignment error of not more than 0.15°, this leads to a distance difference between the transfer chamber sealing surface 3a and the process chamber sealing surface 3b of up to 5 millimeters. The contact pressure of the sealing means 14 must be within a certain range in order firstly to ensure a vacuum-tight seal and secondly to prevent destruction of the sealing means 14. For this purpose, the transfer chamber 1a is provided with support means which permit supporting of the transfer chamber 1a on the respective docked process chamber 1b, 1c or 1d in the evacuated, docked state. Support is provided in a direction substantially parallel to the opening central axis aa of the transfer chamber opening 2a and the opening central axis ab of the process chamber opening 2b. Here, the opening central axes aa and ab are in each case the normal to a plane defined by the sealing surface 3a or 3b, which normal passes through the center of the opening 2a or 2b. The opening central axis aa of the transfer chamber opening 2a and the opening central axis ab of the process chamber opening 2b are only substantially collinear on docking. In the example shown, they have a deviation of 0.15°. As soon as the process chamber opening 2b and the transfer chamber opening 2a are opened, the reduced pressure prevailing in the chambers 1a and 1b results in considerable perpendicular pressing together of the chambers, which is taken up by the support means. In spite of the possible misalignment, the support means adapt according to the invention to the misalignment.

Figure 3:
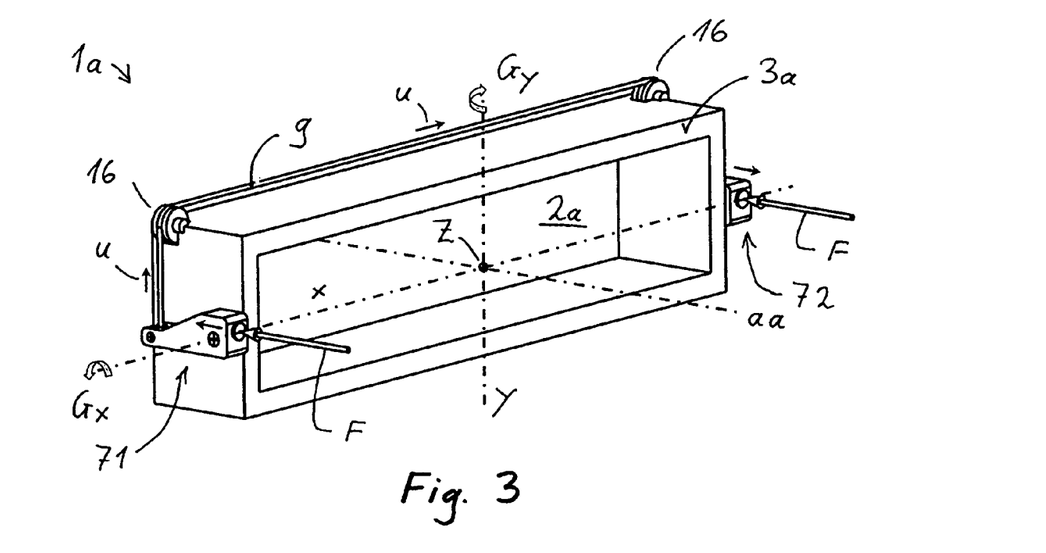
FIG. 3 shows an oblique view of a transfer chamber opening having mechanical support elements and a cable winch as an operative connection.

For this purpose, the support means are in the form of at least two support elements arranged on opposite sides of the transfer chamber opening 2a or alternatively of the process chamber opening 2b and adjustable substantially parallel to the opening central axis aa. In FIG. 3, an oblique view of the transfer chamber opening 2a, the support elements are in the form of mechanical support elements 71 and 72. The two support elements 71 and 72 have an operative connection in the form of a cable winch 9 with one another. The formation of the support elements 71 and 72 and of the cable winch 9 is such that the support elements 71 and 72 have a force and displacement balance relative to one another, with a balance center Z located substantially on the opening central axis aa of the transfer chamber opening 2a. This ensures that, in the docked state, non-parallel opposite positions of the transfer chamber sealing surface 3a and of the process chamber sealing surface 3b are compensated on support. The operative connection between the mechanical support elements 71 and 72 which is produced by the cable winch 9 is such that an adjustment of one support element 71 on docking leads to an equidistant adjustment of the other support element 72 in the opposite direction, substantially parallel to the opening central axis aa, until the two support elements are in balance (cf. FIG. 2), indicated by the arrows in the support elements 71 and 72. The two support elements 71 and 72 thus act in the manner of a rocker with the axis of rotation y.

Thus, a rotational degree of freedom Gy with an axis of rotation y perpendicular to the opening central axis aa and to the connecting axis x of the two support elements 71 and 72 results in the docked state.

The two support elements 71 and 72 are arranged in the middle at the edge of the two narrower sides of the transfer chamber opening 2a, substantially symmetrically to the opening central axis aa, and form in each case a support point. The two support elements 71 and 72 are supported on two opposite support elements 15 fixed to the process chamber 1b, cf. FIGS. 1 and 2. Owing to the virtual point contact of the support elements 71 and 72 with the opposite support elements 15, there is a further rotational degree of freedom Gx with an axis of rotation x perpendicular to the opening central axis aa and parallel, in particular collinear, to the connecting axis x of the two support elements 71 and 72.

The point of intersection of these two axes x and y of the rotational degrees of freedom Gx and Gy forms the balance center Z described above. Thus, the transfer chamber 1a in the docked and supported state has limited movement about the balance center Z.

Since in practice point contact of the support elements 71 and 72 with the opposite support elements 15 can scarcely be realized owing to the high surface pressure, the support elements are designed to be rotatable about the connecting axis x of the two support elements 71 and 72, resulting, in the docked state, in the rotational degree of freedom Gx having an axis of rotation x perpendicular to the opening central axis aa and parallel, in particular collinear, to the connecting axis x of the two support elements 71 and 72.

The mechanical support elements are each in the form of a joint unit 71 and 72 for deflecting a force F acting substantially parallel to the opening central axis aa into a circumferential direction u of the vacuum chamber opening 2a, indicated by the arrows u. The cable winch 9, which is guided around the vacuum chamber opening 2a via two rollers 16, is provided for this purpose, cf. FIG. 3.

Figure 5A:
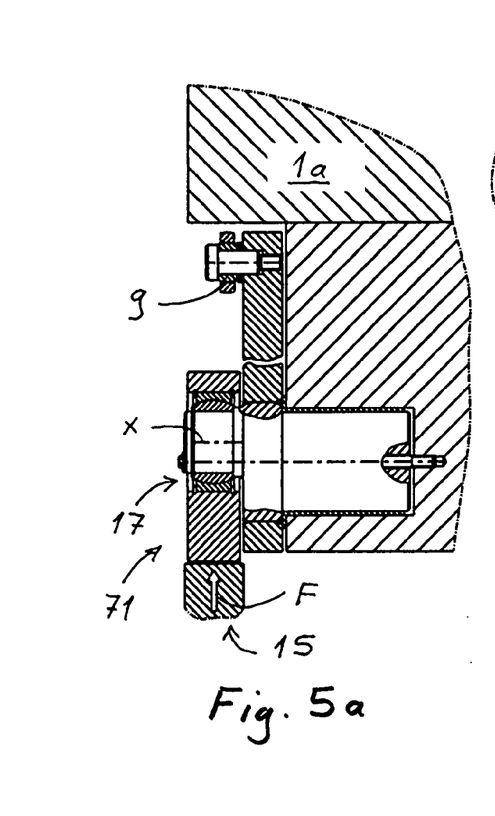
FIG. 5a shows a cross-sectional plan view of the mechanical support element.
Figure 5B:
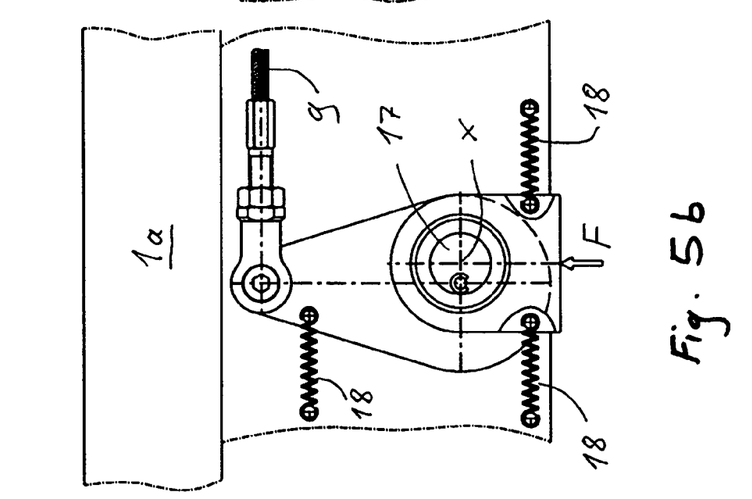
FIG. 5b shows a side view of the mechanical support element.

FIGS. 5a and 5b show in detail the mechanical support element in the form of joint unit 71, in a cross-sectional plan view and a side view. The force F acting parallel to the opening central axis aa, the support force F, between the opposite support element 15 and the joint unit 71, is deflected by means of an eccentric arrangement 17 into a circumferential direction u of the vacuum chamber opening 2a to the cable winch 9. The joint unit 71 is designed to be rotatable about the axis of rotation x so that, in the docked state, the rotational degree of freedom Gx described above results. Springs 18 hold the joint unit 71 in a starting position and clamp the cable winch 9 in the unloaded state.

Figure 5C:
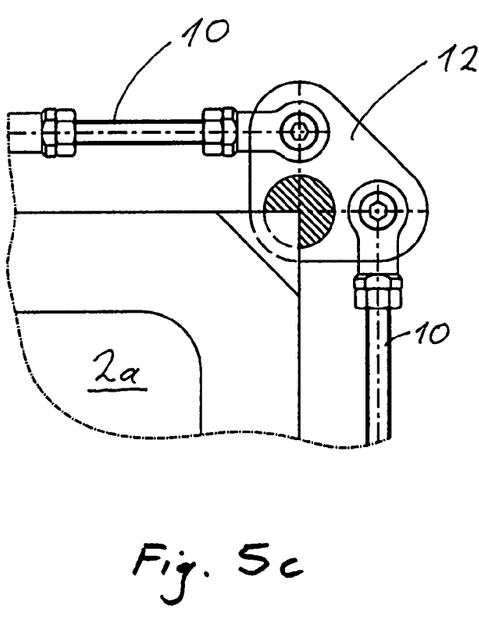
FIG. 5c shows a side view of a joint of a rod system as an operative connection.

Instead of a cable winch 9, it is also possible for the mechanical operative connection to be in the form of a rod system 10 which is connected via joints 12 (cf. FIG. 5c for a detailed view) and which is guided around the vacuum chamber opening 2a.

Figure 4:
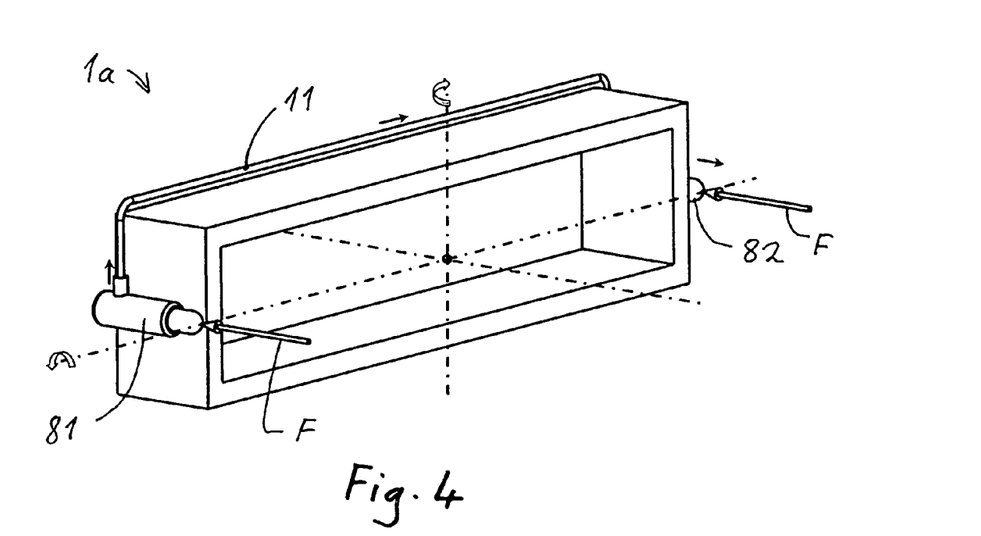
FIG. 4 shows an oblique view of a transfer chamber opening having hydraulic support elements and a hydraulic operative connection.

FIG. 4 shows a further alternative embodiment of the support means. The support elements are each in the form of a single-acting hydraulic cylinder 81 and 82 adjustable parallel to the opening axis aa. The hydraulic cylinders 81 and 82 have a hydraulic operative connection 11 to one another, so that an adjustment of one hydraulic cylinder 81 on docking leads to an equidistant adjustment of the other hydraulic cylinder 82 in the opposite direction, substantially parallel to the opening central axis aa.

It is of course possible to use, for example, four support elements instead of two support elements, the connecting axis of the two additional support elements being the y axis. This results in the same support behavior as described above, but the support elements are subjected to smaller loads. Moreover, the use of a different number of support elements, in particular three, five, six or eight, can be realized. Particularly in the case of a hydraulic operative connection, a triangular arrangement can also easily be realized.

Figure 6:
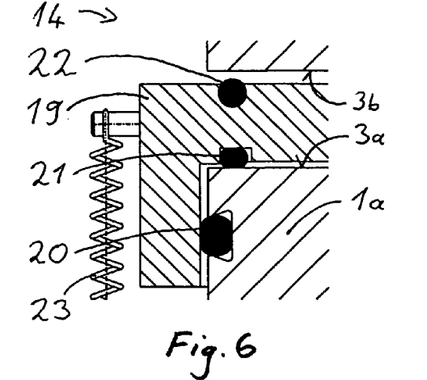
FIG. 6 shows a seal carrier ring having a compensating sealing element in the form of an axially acting sealing ring, in a first embodiment.
Figure 7:
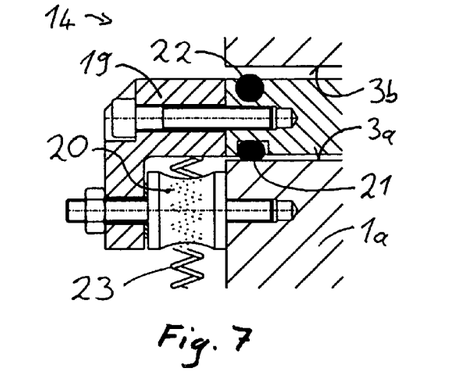
FIG. 7 shows a seal carrier ring having a compensating sealing element in the form of an axially acting sealing ring, in a second embodiment.
Figure 8:
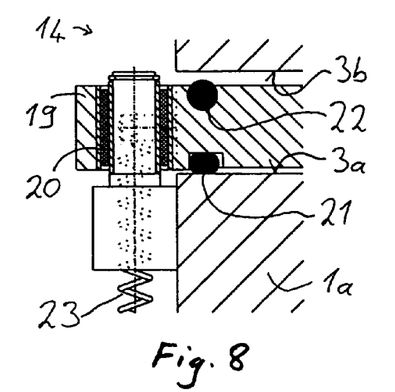
FIG. 8 shows a seal carrier ring having a compensating sealing element in the form of an axially acting sealing ring, in a third embodiment.
Figure 9:
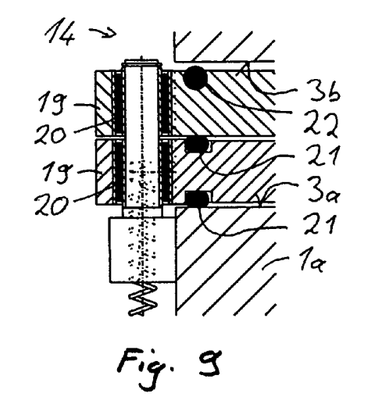
FIG. 9 shows two seal carrier rings having compensating sealing elements in the form of axially acting sealing rings.

In order to ensure the vacuum-tight seal within the above-described distance difference between the transfer chamber sealing surface 3a and the process chamber sealing surface 3b, the invention provides sealing means 14 which are in the form of at least one seal carrier ring 19. FIGS. 6, 7, 8, 9 and 10 show possible embodiments in a detailed cross-sectional view, which are described together below. The seal carrier ring 19 is mounted by means of bearing elements 20 on the transfer chamber sealing surface 3a so as to be displaceable in a direction substantially parallel to the opening central axis aa and tiltable relative to the transfer chamber sealing surface 3a, in such a way that the seal carrier ring 19 in the docked state is present between the transfer chamber sealing surface 3a and the process chamber sealing surface 3b. The seal carrier ring 19 comprises at least one compensating sealing element 21, which is arranged between one vacuum chamber 1a, in particular one vacuum chamber sealing surface 3a, and the seal carrier ring 19, in such a way that, on displacement and/or tilting of the seal carrier ring 19 relative to the transfer chamber sealing surface 3a, vacuum-tight contact is maintained. Furthermore, the seal carrier ring 19 has at least one front sealing element 22 which seals an end face and points toward the process chamber sealing surface 3b and is intended for producing, in the docked state, vacuum-tight contact between the seal carrier ring 19 and the process chamber sealing surface 3b. As a result of the tiltable arrangement of the seal carrier ring 19, it is possible for non-parallel positioning of the transfer chamber sealing surface 3a opposite the process chamber sealing surface 3b, caused by possible misalignments, to be compensated on sealing with a guarantee of vacuum-tight sealing. FIGS. 6, 7, 8 and 9 show embodiments in which the compensating sealing element is in the form of an axially acting, elastic sealing ring 21 which provides vacuum-tight compensation of the tiltability and is fixed axially and radially between one vacuum chamber sealing surface 3a and the seal carrier ring 19. "Axial" is to be understood as meaning substantially parallel to the opening central axis aa, while "radial" is to be understood as meaning in general substantially a direction perpendicular to the opening central axis aa. In FIG. 9, two seal carrier rings 19 having two resilient sealing rings 21 acting axially as a compensating sealing element and providing vacuum-tight compensation of the tiltability are provided. In the embodiment of FIG. 6, resilient strips, in particular rubber strips, distributed over the circumference serve as bearing elements 21. In FIG. 7, rubber buffers distributed along the circumference are provided as bearing elements 21. In FIGS. 8 and 9, the bearing elements 21 are in the form of resilient sleeves. Common to these bearing elements 21 is that they permit even one-sided, i.e. tilting, displacement of the seal carrier ring 9 relative to the transfer chamber 1a. In all working examples of FIG. 6 to 10 the seal carrier ring 19 is mounted on the transfer chamber 1a in such a way, in particular with play, that tilting is possible.

Figure 10:
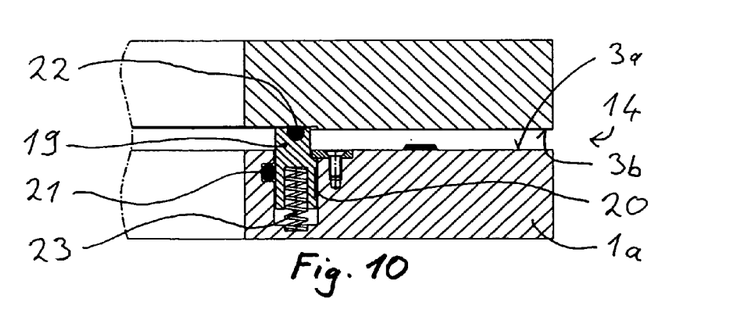
FIG. 10 shows a seal carrier ring having a compensating sealing element in the form of a radially acting sealing ring.

In FIG. 10, the seal carrier ring 19, which is arranged in an axially displaceable manner in an annular groove in an end face on the transfer chamber sealing surface 3a, surrounds a part of the transfer chamber sealing surface 3a. At the same time, a part of the transfer chamber sealing surface 3a at least partly surrounds the seal carrier ring 19. The compensating sealing element in the form of a radially acting sealing ring 21 is arranged radially between the surrounding region of the transfer chamber 1a and the seal carrier ring 19 in such a way that displaceability substantially parallel to the opening central axis aa and tiltability relative to the transfer chamber sealing surface 3a are possible. The front sealing element 32 which seals an end face and points toward the process chamber sealing surface 3b and is intended for producing contact between the seal carrier ring 19 and the other process chamber sealing surface 3b in a vacuum-tight manner in the docked state is in the form of an O-ring. A plastic ring between the transfer chamber 1a and the seal carrier ring 19 serves as bearing element 20.

In all working examples of FIGS. 6 to 10, springs 23 acting in the direction of the transfer chamber 1a are provided for holding the seal carrier rings 19. The bearing elements 20 and springs 23 are distributed with a uniform spacing along the circumference of the transfer chamber sealing surface 3a.

The invention claimed is:
1. A vacuum chamber system for semiconductor processing, comprising
   A) at least two evacuable vacuum chambers which are provided for receiving semiconductor elements to be processed and comprise in each case:
      a vacuum chamber opening through which the semiconductor elements can be transported into and out of the vacuum chamber,
      an opening central axis and
      a vacuum chamber sealing surface which surrounds the vacuum-chamber opening, and
   B) transfer means by which one of the vacuum chambers:
      can be moved relative to another of the vacuum chambers and
      can be docked with it in a vacuum-tight manner via sealing means by production of substantially parallel opposite positions of the vacuum chamber sealing surfaces which are subject to possible misalignments, so that the semiconductor elements can be transported from one vacuum chamber into the other vacuum chamber and vice versa by means of a conveyer apparatus, at least one of the vacuum chambers having support means which support one vacuum chamber on the other vacuum chamber in an evacuated, docked state in a direction substantially parallel to the opening central axes;
   wherein the support means are in the form of at least two support elements which are arranged on opposite sides of the vacuum chamber opening, are adjustable substantially parallel to the opening central axis, have an operative connection to one another and have a force and displacement balance relative to one another with a balance center located substantially on the opening central axis,
   wherein the operative connection between the adjustable support elements is such that an adjustment of one support element on docking in one direction parallel to the opening central axis leads to an substantially equidistant adjustment of the other support element in an opposite direction, substantially parallel to the opening central axis, so that the at least two support elements are in balance,
   wherein in the docked state,
      the at least two support elements provide two rotational degrees of freedom of the two vacuum chambers relative to one another substantially perpendicular to the opening central axis and
      non-parallel opposite positions of the vacuum chamber sealing surfaces caused by possible misalignments are compensated on support.

2. The vacuum chamber system as claimed in claim 1, wherein the at least two support elements are designed to be rotatable about the connecting axis of the at least two support elements so that, in the docked state, one rotational degree of freedom having an axis of rotation perpendicular to the opening central axis and parallel to, in particular collinear with, the connecting axis of the at least two support elements is produced.

3. The vacuum chamber system as claimed in claim 1, wherein:
   the vacuum chamber openings have a rectangular cross-section having unequal sides; and
   at least two support elements each forming a support point are provided on the at least one vacuum chamber; and
   are arranged in the middle at the edge of the two narrower sides of the vacuum chamber opening, substantially symmetrically with respect to the opening central axis.

4. The vacuum chamber system as claimed in claim 1, wherein the at least two support elements have a mechanical operative connection to one another.

5. The vacuum chamber system as claimed in claim 4, wherein the mechanical operative connection is in the form of a cable winch which is guided around the vacuum chamber opening.

6. The vacuum chamber system as claimed in claim 4, wherein the mechanical operative connection is in the form of a rod system which is connected via joints and guided around the vacuum chamber opening.

7. The vacuum chamber system as claimed in claim 4, wherein the at least two support elements are each in the form of a joint unit for deflecting a force acting substantially parallel to the opening central axis to a circumferential direction of the vacuum chamber opening.

8. The vacuum chamber system as claimed in claim 1, wherein the at least two support elements have a hydraulic operative connection to one another.

9. The vacuum chamber system as claimed in claim 8, wherein the at least two support elements are each in a form of a single-action hydraulic cylinder.

10. The vacuum chamber system as claimed in claim 1, wherein the transfer means are formed for linear movement of the at least one vacuum chamber relative to the other vacuum chamber in a direction perpendicular to the opening central axis.

11. The vacuum chamber system as claimed in claim 1, wherein the sealing means are in a form of at least one seal carrier ring which is mounted by means of bearing elements on one vacuum chamber sealing surface so as to be displaceable in the direction substantially parallel to the opening central axis and tiltable relative to one vacuum chamber sealing surface, in such a way that, in the docked state, it is present between one vacuum chamber sealing surface and the other vacuum chamber sealing surface, the sealing means further comprising:
 at least one compensating sealing element which is arranged between the at least one vacuum chamber, and the seal carrier ring in such a way that, on displacement and tilting of the seal carrier ring relative to one vacuum chamber sealing surface, vacuum-tight contact is maintained, and
 at least one front sealing element which seals an end face and points toward the other vacuum chamber sealing surface and is intended for producing contact between the seal carrier ring and the other vacuum chamber sealing surface in a manner which is vacuum-tight in the docked state,
 so that non-parallel positioning of the vacuum chamber sealing surfaces opposite one another, caused by possible misalignments, is compensated on sealing.

12. The vacuum chamber system as claimed in claim 11, wherein:
 the seal carrier ring at least partly surrounds one vacuum chamber sealing surface, or one vacuum chamber sealing surface at least partly surrounds the seal carrier ring, and
 the compensating sealing element is in a form of a radially acting sealing ring which is arranged radially between the surrounded or surrounding region of the at least one vacuum chamber and the seal carrier ring in such a way that the displaceability substantially parallel to the opening central axis and the tiltability relative to one vacuum chamber sealing surface are possible.

13. The vacuum chamber system as claimed in claim 11, wherein the compensating sealing element is in a form of an axially acting, resilient sealing ring which provides vacuum-tight compensation of the tiltability and is arranged axially between one vacuum chamber sealing surface and the seal carrier ring.

14. A vacuum chamber system for semiconductor processing, comprising:

A) at least one first and at least one second evacuable process chamber having in each case:
 at least one processing apparatus for processing semiconductor elements present inside the process chamber,
 a process chamber opening through which the semiconductor elements can be transported into and out of the process chamber, and
 a process chamber sealing surface which surrounds the process chamber opening,
B) transfer means, and
C) an evacuable transfer chamber which can be moved relative to the process chambers by the transfer means and can be docked vacuum-tight with in each case one process chamber and is intended for transporting the semiconductor element between the at least one first and the at least one second process chambers, comprising:
 a transfer chamber opening which can be docked with the process chamber opening and through which the semiconductor elements can be transported from the transfer chamber into the docked process chamber—and vice versa—by means of a conveyer apparatus, and
 a transfer chamber sealing surface which,
 surrounds the transfer chamber opening and
 can be brought by the docking into a substantially parallel position opposite the process chamber sealing surface, which is subject to possible misalignments, vacuum-tight contact between the transfer chamber sealing surface and the process chamber sealing surface being produced by sealing means,
and;
D) support means on at least the transfer chamber or the at least one first process chamber or the at least one second process chamber, which support the transfer chamber on the at least one first or the at least one second process chamber in an evacuated, docked state in a direction substantially parallel to the opening central axes,
 wherein the support means are in a form of at least two support elements which are arranged on opposite sides of the transfer chamber opening or of the process chamber opening, are adjustable substantially parallel to the opening central axis and have an operative connection to one another and have a force and displacement balance relative to one another with a balance center located substantially on the opening central axes of the transfer chamber opening and of the process chamber opening, so that, in the docked state, non-parallel opposite positions of the transfer chamber sealing surface and of the process chamber sealing surface, caused by possible misalignments, are compensated on support.

15. The vacuum chamber system as claimed in claim 14, wherein:
 the at least one first process chamber and the at least one second process chamber are arranged parallel side by side with parallel central axis; and
 the transfer means are formed for linear movement of the transfer chamber relative to the process chambers in a direction substantially perpendicular to the opening central axis.

* * * * *